(12) United States Patent
Eun et al.

(10) Patent No.: US 7,541,243 B2
(45) Date of Patent: Jun. 2, 2009

(54) METHODS OF FORMING INTEGRATED CIRCUIT DEVICES HAVING GATE ELECTRODES FORMED ON NON-UNIFORMLY THICK GATE INSULATING LAYERS

(75) Inventors: Dong-Seog Eun, Seoul (KR); Sung-Nam Chang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 118 days.

(21) Appl. No.: 11/670,546

(22) Filed: Feb. 2, 2007

(65) Prior Publication Data

US 2008/0124866 A1 May 29, 2008

(30) Foreign Application Priority Data

Sep. 7, 2006 (KR) ...................... 10-2006-0086360

(51) Int. Cl.
H01L 21/336 (2006.01)
(52) U.S. Cl. ................ 438/264; 438/287; 257/E21.422; 257/E21.423
(58) Field of Classification Search ................ 438/264, 438/287; 257/E21.422, E21.423
See application file for complete search history.

(56) References Cited

U.S. PATENT DOCUMENTS 6,579,761 B1 6/2003 Hsieh

2003/0207520 A1 11/2003 Tseng

FOREIGN PATENT DOCUMENTS

| KR | 2000-0074388 A | 12/2000 |
|----|---------------|---------|
| KR | 2001-0053905 A | 7/2001 |
| KR | 2001-0064598 A | 7/2001 |
| KR | 1020050057788 A | 6/2005 |
| KR | 1020060006556 A | 1/2006 |

*Primary Examiner*—Matthew Smith
*Assistant Examiner*—Walter H Swanson
(74) *Attorney, Agent, or Firm*—Myers Bigel Sibley & Sajovec (57) ABSTRACT

Methods of forming an integrated circuit device include forming first and second device isolation regions at side-by-side locations within a semiconductor substrate to thereby define a semiconductor active region therebetween. These first and second device isolation regions have sidewalls that extend vertically relative to the semiconductor active region. A first gate insulating layer is formed on a surface of the semiconductor active region. A central portion of the first gate insulating layer extending opposite the semiconductor active region is thinned to thereby define gate insulating residues extending adjacent sidewalls of the first and second device isolation regions. A second gate insulating layer is formed on the gate insulating residues to thereby yield a non-uniformly thick third gate insulating layer. A gate electrode is formed on the non-uniformly thick third gate insulating layer.

9 Claims, 7 Drawing Sheets

Fig. 1

(PRIOR ART)

Fig. 2

(PRIOR ART)

Fig. 3

(PRIOR ART)

Fig. 4

(PRIOR ART)

METHODS OF FORMING INTEGRATED CIRCUIT DEVICES HAVING GATE ELECTRODES FORMED ON NON-UNIFORMLY THICK GATE INSULATING LAYERS

REFERENCE TO PRIORITY APPLICATION

This U.S. non-provisional patent application claims priority under 35 U.S.C. § 119 to Korean Patent Application No. 2006-86360, filed Sep. 7, 2006, the entire contents of which are hereby incorporated herein by reference.

FIELD OF THE INVENTION

The present invention relates to methods of forming semiconductor devices and, more particularly, to methods of forming field effect transistors used in non-volatile memory devices.

BACKGROUND OF THE INVENTION

Figure 1:
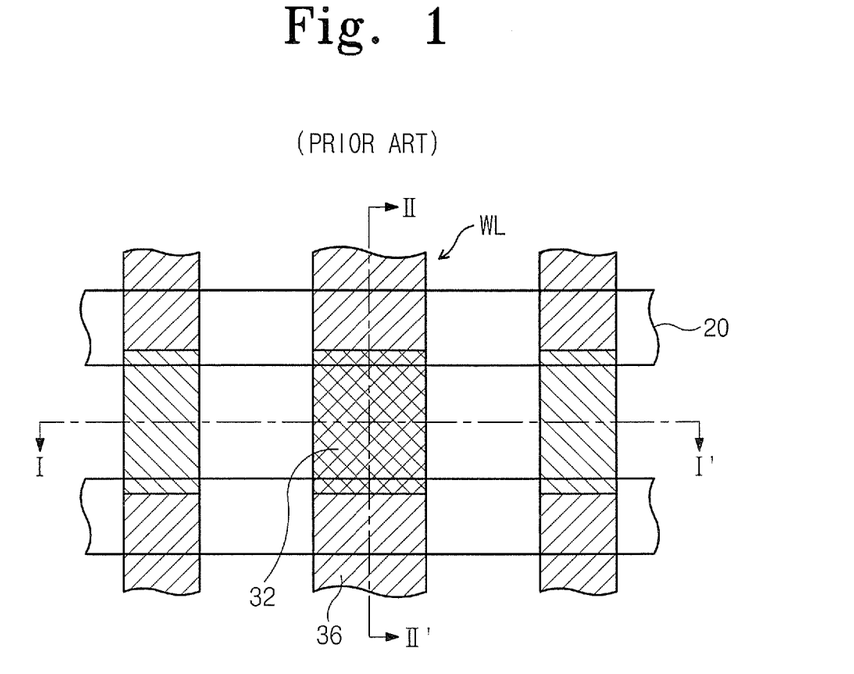
FIGS. 1-4 are cross-sectional views of structures that illustrate a non-volatile memory cell according to the prior art.
Figure 2:
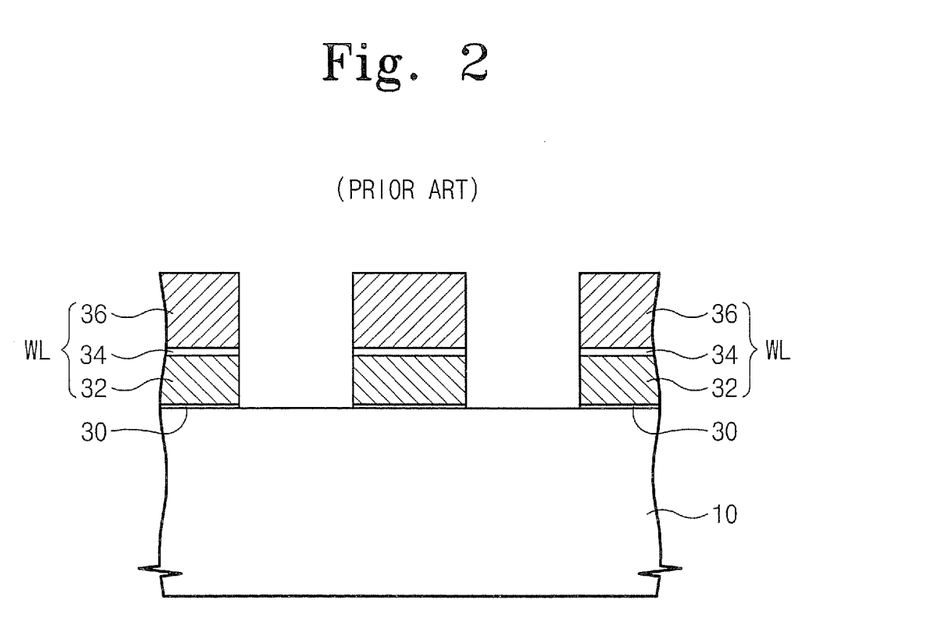
Figure 3:
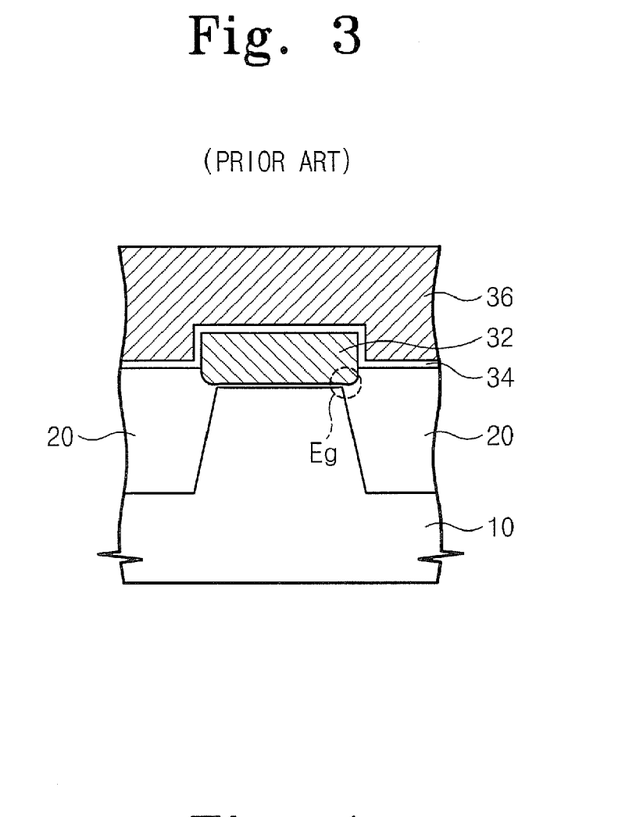

Nonvolatile memory devices can retain stored data even when a power supply is interrupted. FIG. 1 is a layout view of a conventional nonvolatile memory device, and FIGS. 2 and 3 are sectional views taken along lines I-I' and II-II' of FIG. 1, respectively. Referring to FIGS. 1 through 3, in a flash memory device which is a typical nonvolatile memory device, a device isolation layer 20 is formed in a semiconductor substrate 10 to define an active region, and a plurality of word lines WL are formed that cross over the active region and the device isolation layer 20. The word lines WL include a plurality of floating gates 32, control gate electrodes 36, and intergate dielectric layers 34, respectively. The floating gates 32 are formed on the active region. The control gate electrode 36 is formed on the floating gate 32 such that it crosses over the active region and the device isolation layer 20. An intergate dielectric layer 34 is interposed between the floating gate 32 and the control gate electrode 36. Tunnel insulating layers 30 are interposed between the floating gates 32 and the active region.

The floating gate 32 may have the same width as a width of the active region thereunder, or a greater width than the width of the active region, such that the floating gate 32 partially overlaps the device isolation layer 20. The device isolation layer 20 may have a protrusion higher than an upper surface of the active region, and the protrusion of the device isolation layer 20 may contact an entire surface or a portion of a sidewall of the floating gate 32.

An interface trap density ($N_{it}$) may be used to indicate the reliability of a transistor. In the nonvolatile memory device, the value $N_{it}$ represents a silicon lattice damage of an interface of a tunnel oxide layer due to FN tunneling. If $N_{it}$ is high, as the number of write/erase cycle increases, charges become trapped at an interface, gradually decreasing a voltage difference between a write threshold voltage and an erase threshold voltage. As a result, a read margin of program/erase for a memory cell is reduced.

Figure 4:
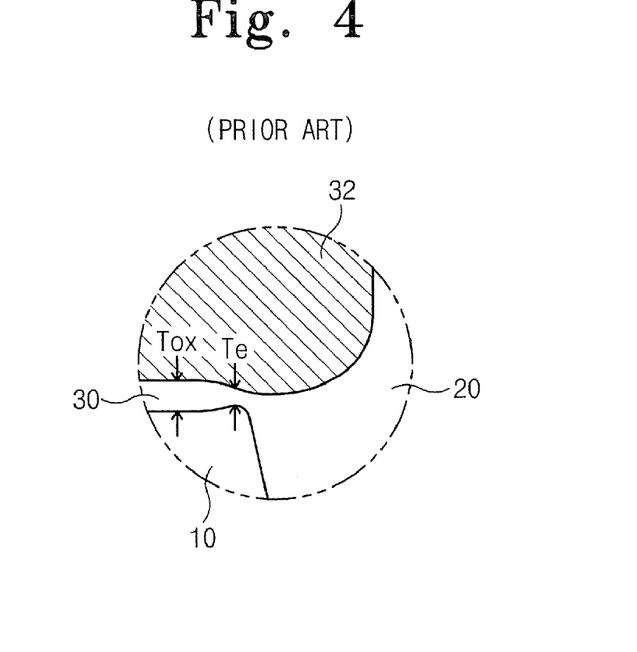

In the nonvolatile memory device, the active region is defined using a shallow trench isolation (STI) process. Here, an edge of the active region may include lattice damage due to a physical stress. When the tunnel insulating layer 30 is formed later, a thickness $t_e$ of the tunnel insulating layer 30 corresponding to an edge of the active region becomes smaller than a thickness $t_{ox}$ of the tunnel insulating layer 30 corresponding to a center of the active region, that is, edge-thinning occurs, as illustrated in FIG. 4. Accordingly, during write/erase operations, an electric field is concentrated and trap density greatly increases in an edge of the active region where the tunnel insulating layer 30 is relatively thin. Since the ratio of an edge to the tunnel insulating layer 30 increases as the active region has a small width, it is estimated that the reliability greatly decreases as a device is highly integrated. Also, as a threshold voltage dispersion of a cell array becomes large, due to a strong electric field formed in an edge of the active region, a decrease of the operating speed of a device may occur.

SUMMARY OF THE INVENTION

Methods of forming semiconductor devices according to embodiments of the present invention include forming a first insulating layer on a semiconductor substrate and forming first and second device isolation regions at side-by-side locations within the semiconductor substrate to thereby define a semiconductor active region therebetween having a first portion of the first insulating layer thereon. These first and second device isolation regions have sidewalls that extend vertically relative to a surface of the first portion of the first insulating layer. A spacer insulating layer is formed onto upper surfaces and the sidewalls of the first and second device isolation regions and onto the surface of the first portion of the first insulating layer. The spacer insulating layer is selectively etched back for a sufficient duration to remove portions of the spacer insulating layer from the upper surfaces of the first and second device isolation regions and define insulating spacers on the sidewalls. These insulating spacers overlap edges of the first portion of the first insulating layer. The first portion of the first insulating layer is etched for a sufficient duration to expose a portion of the semiconductor active region, yet leave residues of the first insulating layer that extend underneath the insulating spacers. A non-uniformly thick gate insulating layer is then formed by depositing a second insulating layer on the exposed portion of the semiconductor active region and on the residues of the first insulating layer. A gate electrode is then formed on the non-uniformly thick gate insulating layer.

According to additional ones of these embodiments, the step of forming a gate electrode is preceded by forming a charge trap insulating layer on the non-uniformly thick gate insulating layer. This charge trap insulating layer may have a dielectric constant that is greater than a dielectric constant of the second insulating layer. A charge blocking electrically insulating layer may also be formed on the charge trap insulating layer. The use of a charge trap insulating layer and a charge blocking layer support the formation of a charge-trap type non-volatile memory device.

According to additional embodiments of the invention, the step of forming first and second device isolation regions is preceded by forming a hard mask layer on the first insulating layer and patterning the hard mask layer. The first insulating layer is then selectively etched to expose the semiconductor substrate. This etching step is performed using the patterned hard mask layer as an etching mask. Moreover, the step of forming first and second device isolation regions may include selectively etching the semiconductor substrate to define first and second trenches therein and filling the first and second trenches with an electrically insulating material. In particular, the step of forming first and second device isolation regions may include selectively etching the semiconductor substrate to define first and second trenches therein and filling the first and second trenches and openings in the patterned hard mask layer with electrically insulating material. The hard mask layer and the spacer insulating layer may include the same materials.

Still further embodiments of the present invention include forming first and second device isolation regions at side-by-side locations within a semiconductor substrate to thereby define a semiconductor active region therebetween. These first and second device isolation regions have sidewalls that extend vertically relative to the semiconductor active region. A first tunnel insulating layer is formed on a surface of the semiconductor active region. A central portion of the first tunnel insulating layer extending opposite the semiconductor active region is thinned (e.g., etched) to thereby define tunnel insulating residues extending adjacent sidewalls of the first and second device isolation regions. A second tunnel insulating layer is formed on the tunnel insulating residues to thereby yield a non-uniformly thick third tunnel insulating layer. A floating gate electrode is formed on the non-uniformly thick third tunnel insulating layer. According to some aspects of these embodiments, the step of forming a floating gate electrode is preceded by forming a charge trap layer on the non-uniformly thick third tunneling insulating layer. This charge trap layer may be a dielectric layer having a higher dielectric constant relative to the non-uniformly thick third tunneling insulating layer. Alternatively, the charge trap layer may be an electrically insulating layer having metal atoms or silicon dots dispersed therein.

Still further embodiments of the present invention include methods of forming an integrated circuit device by forming first and second device isolation regions at side-by-side locations within a semiconductor substrate to thereby define a semiconductor active region therebetween. These first and second device isolation regions have sidewalls that extend vertically relative to the semiconductor active region. A first gate insulating layer is formed on a surface of the semiconductor active region. A central portion of the first gate insulating layer extending opposite the semiconductor active region is then thinned to thereby define gate insulating residues extending adjacent sidewalls of the first and second device isolation regions. A second gate insulating layer is formed on the gate insulating residues to thereby yield a non-uniformly thick third gate insulating layer. A gate electrode is formed on the non-uniformly thick third gate insulating layer.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the figures, the dimensions of layers and regions are exaggerated for clarity of illustration. It will also be understood that when a layer is referred to as being 'on' another layer or substrate, it can be directly on the other layer or substrate, or intervening layers may also be present. Like reference numerals refer to like elements throughout.

Figure 5:
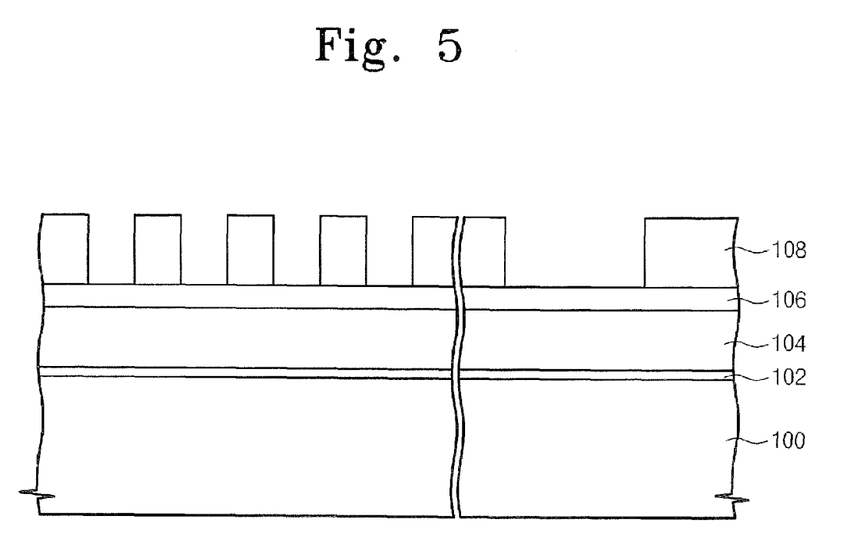
FIGS. 5-13 are cross-sectional views of intermediate structures that illustrated methods of forming semiconductor devices according to embodiments of the present invention.

FIGS. 5 through 13 are views for illustrating a method of fabricating a semiconductor device according to the present invention. Referring to FIG. 5, a first insulating layer 102 is formed on a semiconductor substrate 100, and a hard mask layer is formed on the first insulating layer 102. The first insulating layer 102 may become a gate insulating layer, and may be formed of a silicon oxide layer. The hard mask layer may be formed of a layer having an etch selectivity with respect to the semiconductor substrate 100. The semiconductor substrate 100 is used for fabricating a semiconductor device, and may be a silicon substrate or a silicon-germanium substrate, for example. Therefore, the hard mask layer may be formed of a material having a relatively low etching rate compared to the semiconductor substrate when the semiconductor substrate 100 is etched, and may be formed of a silicon nitride layer 104. Here, a single layer of the silicon nitride layer 104 may be used for the hard mask layer, or a silicon oxide layer 106 (optional) may be further formed on the silicon nitride layer 104. A photoresist pattern 108 is then formed on the hard mask layer.

Figure 6:
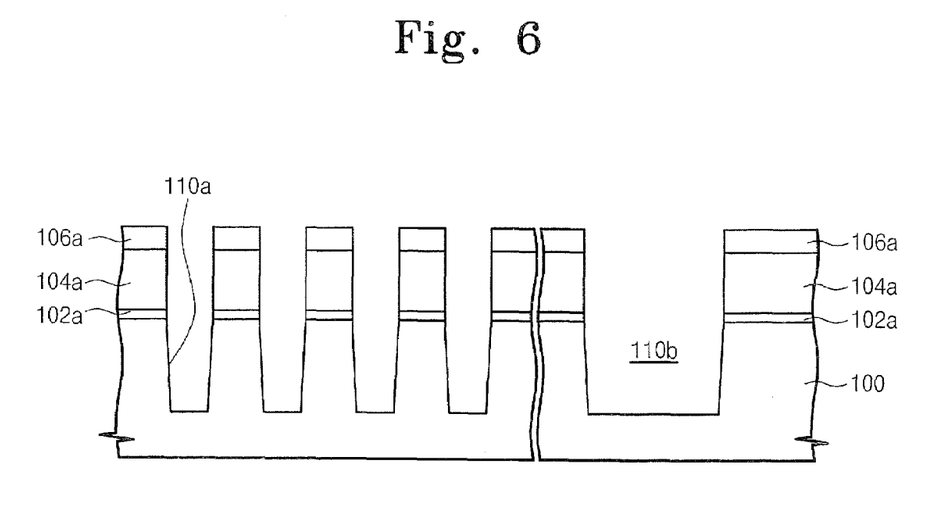

Referring to FIG. 6, the hard mask layer is etched to form a hard mask pattern. The hard mask pattern may include a silicon nitride layer pattern 104a and a silicon oxide layer pattern 106a. The first insulating layer 102 and the semiconductor substrate 100 are etched using the hard mask pattern as an etch mask to form trench regions 110a and 110b in the semiconductor substrate 100. This etching step also results in the formation of a first insulating layer pattern 102a. The semiconductor substrate 100 may include regions divided to form devices of different characteristics. For example, a first region that is a low voltage region or a cell array region, and a second region that is a high voltage region. In the present embodiment, a trench region formed in the first region is referred to as a first trench region 110a, and a trench region formed in the second region is referred to as a second trench region 110b. The first and second trench regions 110a and 110b may have a different depth from each other. According to circumstances, the first and second trench regions 110a and 110b may have a stepped sidewall.

Figure 7:
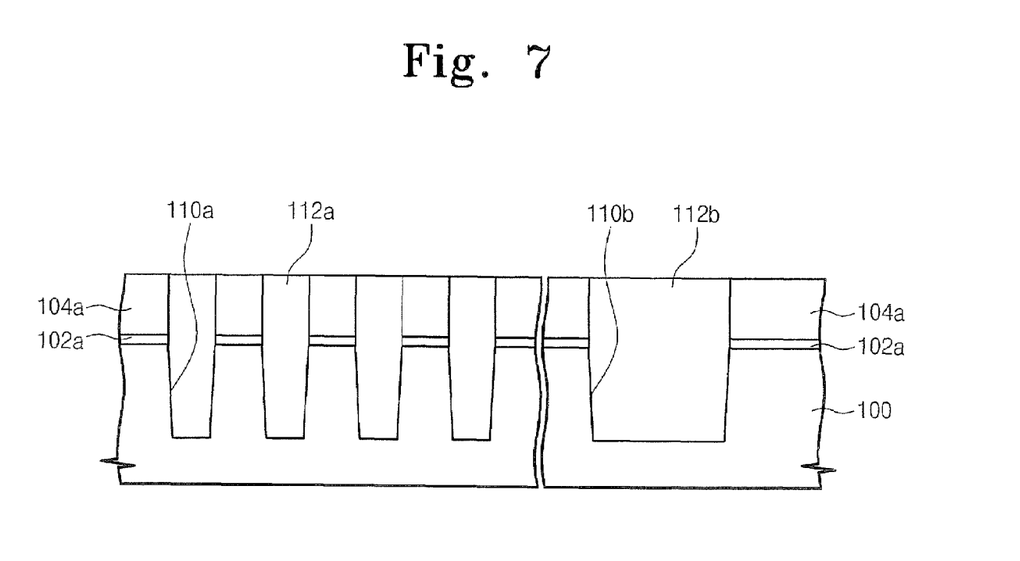

Referring to FIG. 7, an insulating layer is formed on an entire surface of the semiconductor substrate 100 to fill a gap region where the first and second trench regions 110a and 110b are formed. A general device isolation technology may be applied to the insulating layer, and various materials and forming methods may be made and applied within the extent of a general technology. The insulating layer is planarized to form a first device isolation layer 112a filled in the first trench region 110a and a gap above the first trench region 110a, and a second device isolation layer 112b filled in the second trench region 110b and a gap above the second trench region 110b. The insulating layer may be planarized using a chemical mechanical polishing (CMP) process. The silicon oxide pattern 106a of the hard mask layer may be removed while the insulating layer is being planarized.

Figure 8:
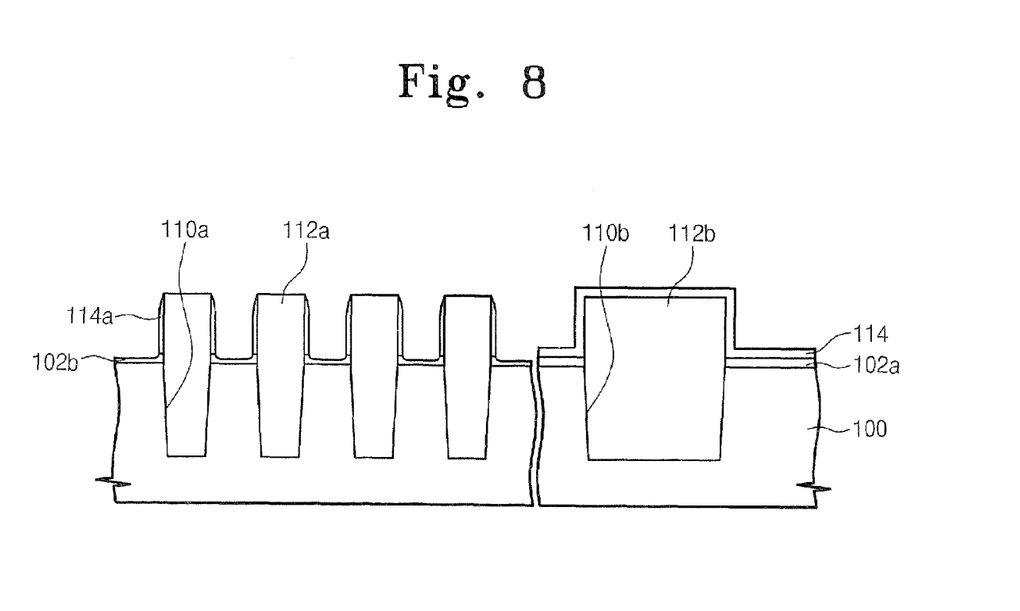

Referring to FIG. 8, the hard mask pattern 104a is removed to expose the first insulating layer pattern 102a on a first active region between the first device isolation layers 112a and on a second active region between the second device isolation layers 112b, and to expose protruding sidewalls of the first and second device isolation layers 112a and 112b. A spacer insulating layer 114 is formed on an entire surface of the semiconductor substrate 100. The spacer insulating layer 114 may be formed of a material having an etch selectivity with respect to the first insulating layer pattern 102a, which may be a silicon oxide layer. The spacer insulating layer 114 may be a silicon nitride layer having an etch selectivity with respect to silicon oxide. The spacer insulating layer 114 may be formed conformally along a surface profile of the semiconductor substrate 100.

The spacer insulating layer 114 is selectively etched to form a spacer pattern 114a on sidewalls of the first device isolation layer 112a. A width of the spacer pattern 114a formed on the first active region may be determined by controlling a thickness of the spacer insulating layer 114 and etching conditions. While the spacer pattern 114a is formed, a portion of the first insulating layer 102 may be etched to form a first insulating layer pattern 102b recessed to a predetermined depth. When the spacer pattern 114a is formed, the spacer insulating layer 102 covering the second device isolation layer 112b of the second region and the first insulating layer pattern 102a on the second active region will remain.

Figure 9:
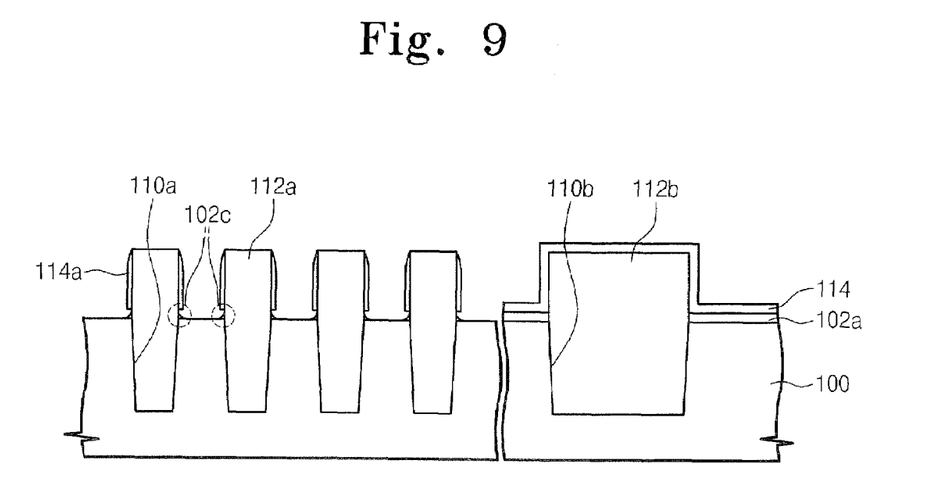

Referring to FIG. 9, the recessed first insulating layer pattern 102b is etched using the spacer pattern 114a and the spacer insulating layer 114 as an etch mask to expose a portion of the first active region. A residual layer 102c of the first insulating layer may remain in an edge of the first active region, that is, the first active region adjacent to the first device isolation layer 112a. The first insulating layer pattern 102b may be removed using isotropic etching. As a result, the residual layer 102c of the first insulating layer may remain in an edge of the first active region, and the first insulating layer pattern 102a may remain on the second active region.

Figure 10:
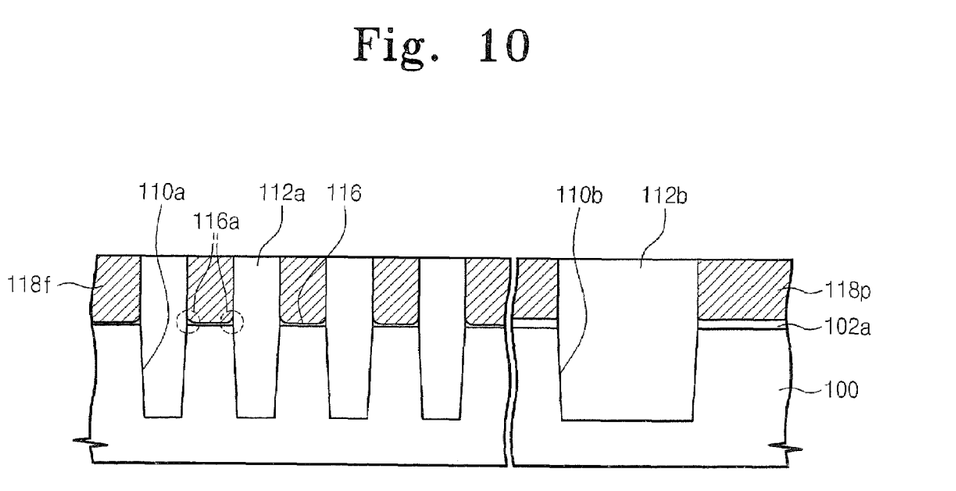

Referring to FIG. 10, the spacer insulating layer 114 and the spacer pattern 114a are removed to expose protruding sidewalls of the first and second device isolation layers 112a and 112b. The spacer insulating layer 114 may be removed using isotropic etching or using wet etching. A portion of the first active region is exposed between the protruding sidewalls of the first device isolation layer 112a, and the residual layer 102c of the first insulating layer remains in an edge of the first active region. A second insulating layer is formed on the first active region to form a gate insulating layer 116. The gate insulating layer 116 is formed of a multilayer having the residual layer 102c of the first insulating layer and the second insulating layer, and thus may include a thick portion 116a in an edge of the first active region, and may be formed relatively thin on the first active region between the thick portions 116a.

If the first active region is used as a channel region of a low voltage transistor or a cell transistor, the second insulating layer may be formed thinner than the first insulating layer. The gate insulating layer 116 may be used as a tunnel insulating layer of a cell transistor or a gate insulating layer of a low voltage transistor, and the first insulating layer pattern 102a may be used as a gate insulating layer of a high voltage transistor. In the case of a charge trap type nonvolatile memory device, the gate insulating layer 116 may be a stacked layer of a tunnel insulating layer, a charge trap insulating layer, and a blocking insulating layer. Here, the charge trap insulating layer may be a high dielectric layer or an insulating layer in which metal and silicon dots are dispersed.

A conductive layer is formed on an entire surface of the semiconductor substrate 100 to fill a gap region on the gate insulating layer 116 and the first insulating layer pattern 102a. The conductive layer is filled between sidewalls of the first device isolation layer 112a and between sidewalls of the second device isolation layer 112b. The conductive layer is planarized until the first and second device isolation layers 112a and 112b are exposed to form a gate pattern between the sidewalls of the first device isolation layer 112a and between the sidewalls of the second device isolation layer 112b, respectively. In the case of a floating gate type nonvolatile memory device, a gate pattern 118f between the sidewalls of the first device isolation layer 112a may become a floating gate pattern, and a gate pattern 118p between the sidewalls of the second device isolation layer 112b may become a gate pattern for a peripheral circuit transistor. In the case of a charge trap type nonvolatile memory device, the conductive layer contacting the gate insulating layer 116 may be formed of a material having a low work function, such as a metal or a metal alloy.

Figure 11:
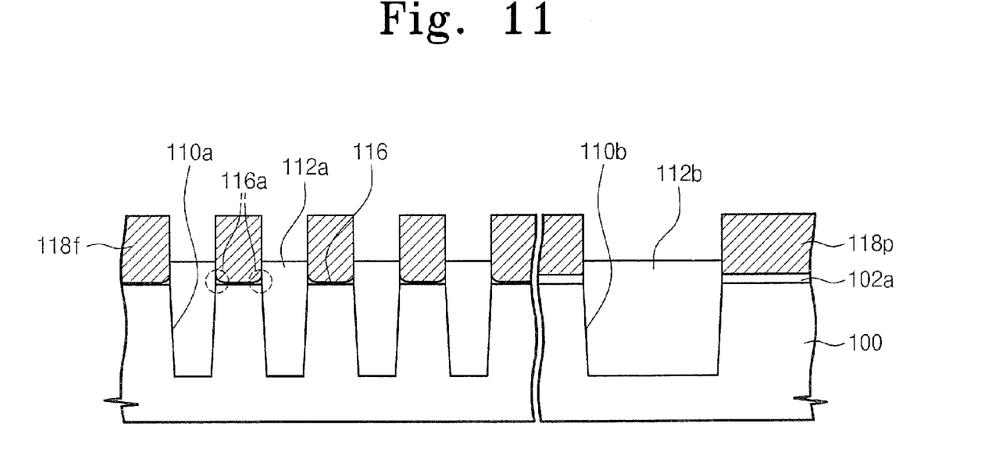

Referring to FIG. 11, a protruding portion of the first device isolation layer 112a between the gate patterns 118f and a protruding portion of the second device isolation layer 112b between the gate patterns 118p are partially recessed to partially expose sidewalls of the gate patterns 118f and 118p. Here, only the sidewalls of the floating gate pattern 118f may be selectively exposed, and sidewalls of a gate pattern for forming a gate pattern of a low voltage transistor and a high voltage transistor may be exposed similarly to the sidewalls of the floating gate pattern 118f. The protruding portion of the device isolation layer may be recessed so that an upper surface of the device isolation layers 112a and 112b is approximately 50 Å higher than the gate insulating layer 116.

Figure 12:
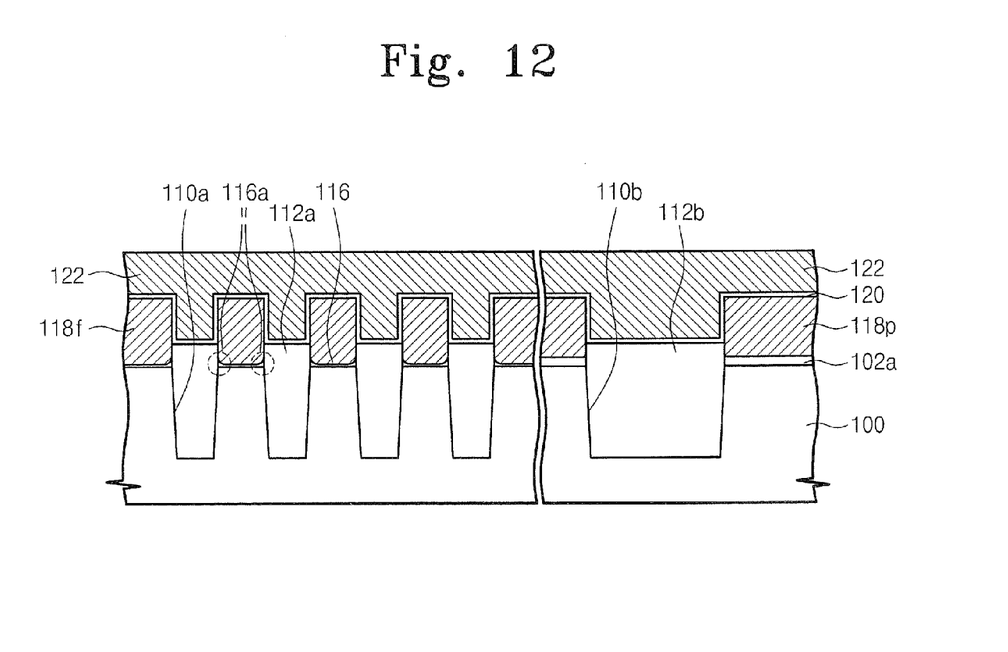

Referring to FIG. 12, an intergate dielectric layer 120 is formed conformally along a surface profile on the semiconductor substrate 100. The intergate dielectric layer 120 may include a high dielectric layer. The intergate dielectric layer 120 may cover upper surfaces and sidewalls of the gate patterns 118f and 118p exposed by recessing the device isolation layers 112a and 112b. A gate conductive layer 122 is formed on the intergate dielectric layer 120. The gate conductive layer 122 may be filled in a gap region of the floating gate pattern 118.

Figure 13:
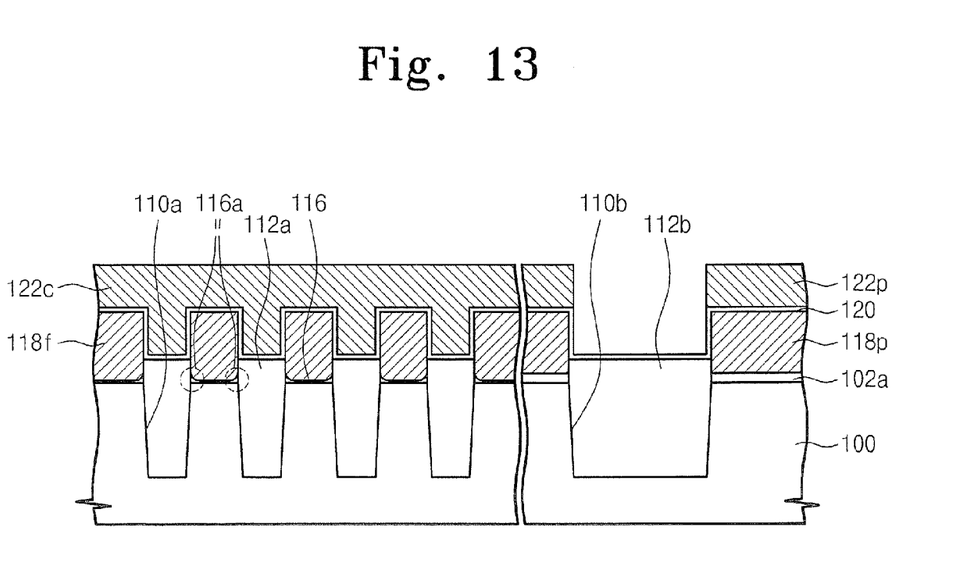

Referring to FIG. 13, the gate conductive layer 122 is patterned to form a control gate electrode 122c so as to cross over the floating gate patterns 118f and the first device isolation layer 112a. The intergate dielectric layer 120 and the floating gate pattern 118f are patterned to form floating gates in the first active regions under the control gate electrode 122c, respectively, such that the floating gates are aligned with the control gate electrode 122c.

While the control gate electrode 122c is formed, the gate conductive player 122 of the second region may be patterned to form an upper gate pattern 122p constituting a gate electrode of a peripheral circuit transistor in the second region, and the gate pattern 118p of the second region may be patterned to form a lower gate pattern. The intergate dielectric layer 120 between the lower and upper gate patterns may be etched prior to the forming of the gate conductive layer 122, or the low and upper gate patterns may be electrically connected with each other in a process to be performed later to form a gate electrode including the upper and lower gate patterns.

As illustrated in FIG. 13, the gate insulating layer 116 is thicker at an edge of the first active region than at a center of the first active region, thereby preventing problems that may be generated as a gate insulating layer becomes thinner toward an edge of an active region. The gate insulating layer 116 may have an edge portion approximately 1.2-2 times larger than a center portion on the active region. Also, an upper surface of the control gate electrode may be formed to the same height as an upper surface of the upper gate pattern. This prevents a step difference from being created in a cell array region and a peripheral circuit region.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of forming an integrated circuit device, comprising:

forming first and second device isolation regions at side-by-side locations within a semiconductor substrate to thereby define a semiconductor active region therebetween, said first and second device isolation regions having sidewalls that extend vertically relative to the semiconductor active region;

forming a first gate insulating layer on a surface of the semiconductor active region;

thinning a central portion of the first gate insulating layer extending opposite the semiconductor active region to thereby define gate insulating residues extending adjacent sidewalls of the first and second device isolation regions;

forming a second gate insulating layer on the gate insulating residues to thereby yield a non-uniformly thick third gate insulating layer; and forming a gate electrode on the non-uniformly thick third gate insulating layer.

2. The method of claim 1, wherein said forming a gate electrode is preceded by forming a charge trap layer on the non-uniformly thick third gate insulating layer.

3. The method of claim 2, wherein the charge trap layer is a dielectric layer having a higher dielectric constant relative to the non-uniformly thick third gate insulating layer.

4. The method of claim 2, wherein the charge trap layer is an electrically insulating layer having metal atoms or silicon dots dispersed therein.

5. The method of claim 1, wherein the integrated circuit device is a non-volatile memory device; wherein the first gate insulating layer is a first tunnel insulating layer; wherein the second gate insulating layer is a second tunnel insulating layer; wherein the non-uniformly thick third gate insulating layer is a non-uniformly thick third tunnel insulating layer; and wherein forming a gate electrode comprises forming a floating gate electrode on the non-uniformly thick third tunnel insulating layer.

6. The method of claim 5, wherein forming a floating gate electrode is preceded by forming a charge trap layer on the non-uniformly thick third tunnel insulating layer.

7. The method of claim 6, wherein the charge trap layer is a dielectric layer having a higher dielectric constant relative to the non-uniformly thick third tunnel insulating layer.

8. The method of claim 1, wherein said thinning a central portion of the first gate insulating layer is preceded by:

forming a spacer insulating layer on the sidewalls of the first and second device isolation regions and onto an upper surface of the first gate insulating layer; and selectively etching back the spacer insulating layer for a sufficient duration to remove a portion of the spacer insulating layer from the upper surface of the first gate insulating layer and thereby define sidewall insulating spacers on the sidewalls that cover underlying portions of the first gate insulating layer.

9. The method of claim 8, wherein said thinning a central portion of the first gate insulating layer comprises selectively etching the central portion of the first gate insulating layer using the sidewall insulating spacers to inhibit etching of the underlying portions of the first gate insulating layer.

* * * * *